(12) United States Patent
Li et al.

(10) Patent No.: US 9,162,303 B2
(45) Date of Patent: Oct. 20, 2015

(54) GROOVED CIRCUIT BOARD ACCOMMODATING MIXED-SIZE COMPONENTS

(75) Inventors: Fan Li, Waterloo (CA); Jie Huang, Waterloo (CA); Surinder Jassal, Oakville (CA)

(73) Assignee: BLACKBERRY LIMITED, Waterloo (CA)

( * ) Notice: Subject to any disclaimer, the term of this patent is extended or adjusted under 35 U.S.C. 154(b) by 1125 days.

(21) Appl. No.: 13/187,881

(22) Filed: Jul. 21, 2011

(65) Prior Publication Data

US 2013/0021763 A1   Jan. 24, 2013

(51) Int. Cl.
*B05D 5/12* (2006.01)
*B23K 1/00* (2006.01)
*C23C 18/18* (2006.01)
*B05D 1/32* (2006.01)
*C23C 18/06* (2006.01)
*H05K 3/42* (2006.01)
*H05K 3/12* (2006.01)
*B23K 1/008* (2006.01)
*B23K 1/20* (2006.01)
*B23K 3/06* (2006.01)
*H05K 1/11* (2006.01)
*B05D 3/00* (2006.01)
*H05K 5/00* (2006.01)

(52) U.S. Cl.
CPC ............... *B23K 1/0016* (2013.01); *B05D 1/32* (2013.01); *B23K 1/008* (2013.01); *B23K 1/20* (2013.01); *B23K 3/0638* (2013.01); *C23C 18/06* (2013.01); *C23C 18/18* (2013.01); *H05K 1/119* (2013.01); *H05K 3/1216* (2013.01); *H05K 3/1233* (2013.01); *H05K 3/42* (2013.01); *B05D 3/002* (2013.01); *B05D 5/12* (2013.01); *B23K 2201/42* (2013.01); *H05K 5/00* (2013.01); *H05K 2201/09036* (2013.01); *H05K 2201/10371* (2013.01)

(58) Field of Classification Search
USPC ............ 427/96.2–96.6, 97.7, 98.5, 98.8, 282
See application file for complete search history.

(56) References Cited

U.S. PATENT DOCUMENTS

| 4,985,601 | A | 1/1991 | Hagner |
| 5,443,586 | A | 8/1995 | Cargill |
| 5,451,722 | A | 9/1995 | Gregoire |
| 5,543,586 | A | 8/1996 | Crane, Jr. et al. |
| 6,066,386 | A | 5/2000 | Boyko et al. |
| 6,462,436 | B1 | 10/2002 | Kay |
| 6,963,494 | B2 | 11/2005 | Mickievicz et al. |

(Continued)

FOREIGN PATENT DOCUMENTS

EP   1445999 A1   8/2004

OTHER PUBLICATIONS

Pan, Jianbiao, et al. "Critical Variables of Solder Paste Stencil Printing for Micro-BGA and Fine Pitch QFP." Report No. 99T-05.

*Primary Examiner* — Brian K Talbot
(74) *Attorney, Agent, or Firm* — Perry + Currier Inc.

(57) ABSTRACT

A circuit board, associated assembly, and method of manufacture. The circuit board comprises an elongated groove, extending into the circuit board, for accommodating a footing of a large component such as an RF shield. The groove allows solder paste to be deposited therein via a stencil, to a depth greater than the stencil thickness. Thus the same stencil can be used for depositing solder paste for both small and large components.

17 Claims, 8 Drawing Sheets

(56) References Cited

U.S. PATENT DOCUMENTS

| | | |
|---|---|---|
| 7,132,357 B2 | 11/2006 | Underwood et al. |
| 7,218,530 B2 | 5/2007 | Mickievicz et al. |
| 8,338,950 B2 * | 12/2012 | Ono et al. ............ 257/741 |
| 2001/0002877 A1 | 6/2001 | Alina |
| 2005/0146821 A1 * | 7/2005 | Fjelstad et al. ............ 361/56 |
| 2007/0268674 A1 * | 11/2007 | Bauer et al. ............ 361/730 |
| 2010/0020535 A1 | 1/2010 | Sharrah et al. |
| 2010/0084752 A1 * | 4/2010 | Horning et al. ............ 257/682 |
| 2010/0089619 A1 | 4/2010 | Chen et al. |
| 2010/0117218 A1 * | 5/2010 | Park et al. ............ 257/693 |

* cited by examiner

GROOVED CIRCUIT BOARD ACCOMMODATING MIXED-SIZE COMPONENTS

CROSS-REFERENCE TO RELATED APPLICATIONS

This is the first application filed for the present technology.

TECHNICAL FIELD

The present technology relates generally to circuit boards and circuit assemblies comprising same, and, in particular, to circuit boards for accommodating a variety of component sizes.

BACKGROUND

Printed circuit boards allow for reliable and cost-effective production of electronic devices. A common technique for populating printed circuit boards with components, for example surface-mount components, involves applying solder paste to desired areas of a printed circuit board through a specially configured stencil. The components are then pressed into the solder paste, and the populated circuit board is passed through an oven to reflow the solder paste.

Some printed circuit assemblies call for a mixture of different sized components, such as small or fine-pitched component leads alongside components with large leads or a large footing to be attached to the circuit board. This situation arises, for example, when a radiofrequency (RF) shield is used to isolate other electronic components. The RF shield is the large component, while the other electronics are configured to be placed on the circuit board underneath the RF shield and are hence smaller.

However, providing an appropriate amount of accurately placed solder paste for both large and small components presents a challenge. For example, a thinner stencil is generally conducive for applying solder paste for smaller components, whereas a thicker stencil is generally conducive for applying solder paste for larger components. Previous solutions to this problem include using multiple stencils with multiple rounds of solder paste application, and using specialized "step" stencils having variable thickness. This can introduce cost and complexity into the manufacturing process, and can reduce quality yields in the finished product.

BRIEF DESCRIPTION OF THE DRAWINGS

Further features and advantages of the present technology will become apparent from the following detailed description, taken in combination with the appended drawings, in which.

It will be noted that throughout the appended drawings, like features are identified by like reference numerals.

DETAILED DESCRIPTION

The present technology generally provides a circuit board, method of preparing a circuit board, and method of manufacturing a circuit assembly comprising a circuit board, wherein the circuit board comprises a groove configured to receive conductive paste.

Accordingly, an aspect of the present technology provides a circuit board. The circuit board comprises a surface layer having a predetermined region configured to accommodate a first component and an insulating layer adjacent to the surface layer. An elongated groove is formed in the surface layer adjacent to the predetermined region, the elongated groove extending a predetermined distance into the insulating layer. Hence a bottom of the groove may comprise conductive material such as copper, adequately patterned and isolated from other copper traces, and optionally connected to a ground plane, for example. In some embodiments, the elongated groove may extend partway to or even beyond such an interior conductive layer. The elongated groove is configured to accommodate a corresponding elongated footing of a second component. In some embodiments, the elongated groove comprises conductive material such as copper plated onto the sidewalls, groove bottom, or both. The elongated footing may define a substantial portion of a perimeter of the second component. A body portion of the second component may extend overtop of the first component.

In embodiments of the present technology, the elongated groove generally extends to an interior conductive layer of a multilayer printed circuit board. By extending the groove to terminate at an interior conductive layer, a component accommodated by the groove can be electrically connected to that interior conductive layer. The interior conductive layer may in turn be connected to a power plane, ground plane, other electronic components or signal traces, or the like, or a combination thereof. Terminating the groove at an interior conductive layer also provides for a conductive bottom of the groove, which facilitates retention of conductive pastes such as solder paste.

Figure 1A:
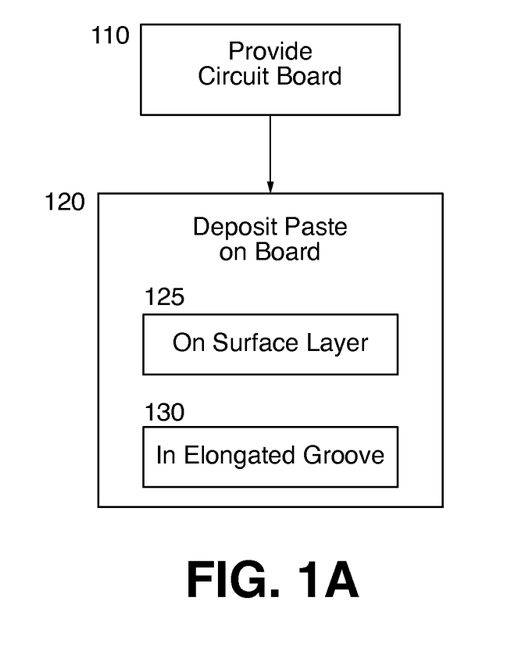
FIG. 1A illustrates a method of preparing a circuit board for assembly according to embodiments of the present technology.

Another aspect of the present technology provides a method of preparing a circuit board for assembly. With reference to FIG. 1A, the method comprises: providing 110 the circuit board as described above; and depositing 120 conductive paste onto the circuit board, for example via a stencil in a paste printing process. In some embodiments, a single stencil with uniform thickness may be used in a one-pass printing process for both small and large components, thus simplifying the process. The conductive paste is deposited 125 on the predetermined region of the circuit board surface layer in a pattern corresponding to a footprint of the first component. The conductive paste is further deposited 130 in the elongated groove of the circuit board for reliably accommodating the elongated footing of the second component. In some embodiments, at least a portion of the elongated groove may be pre-filled with solder paste prior to printing. Pre-filling of paste may be facilitated via stencil, targeted paste injection, wave soldering, or the like.

Figure 1B:
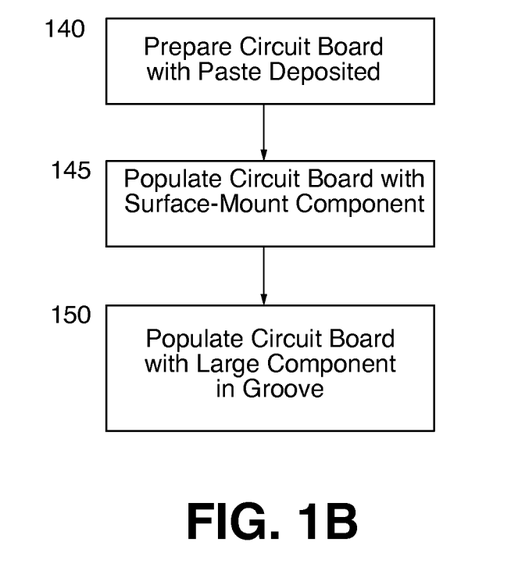
FIG. 1B illustrates a method of preparing a circuit board for assembly according to embodiments of the present technology.

Yet another aspect of the present technology provides a method of manufacturing a circuit assembly comprising the circuit board as described above. With reference to FIG. 1B, the method comprises: preparing the circuit board 140 as described above with respect to FIG. 1A; and populating the circuit board with at least the first component 145 followed by at least the second component 150. Thus, the second component, such as an RF shield, may be placed overtop of a smaller first component.

Figure 2:
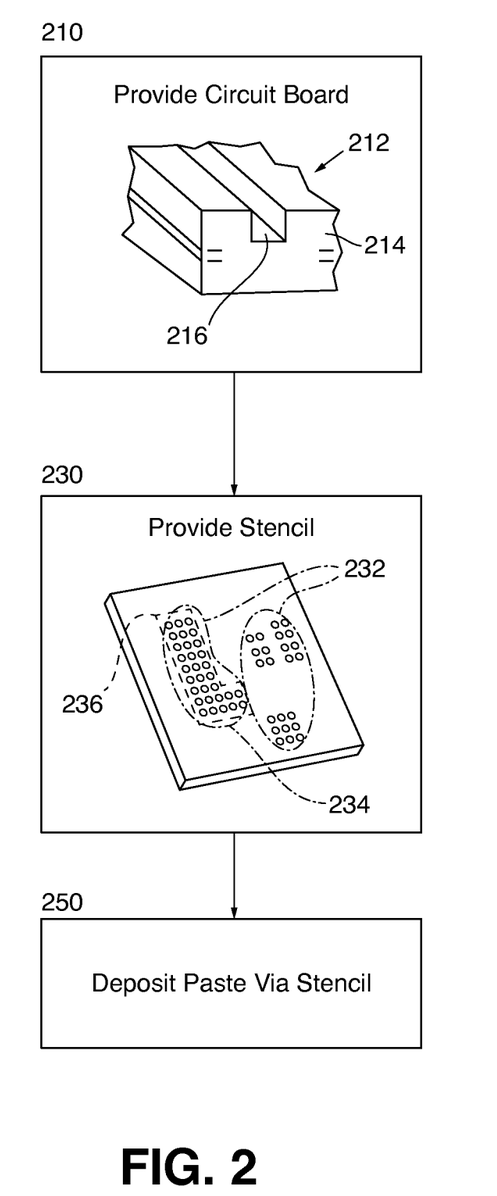
FIG. 2 illustrates a method of preparing a circuit board for assembly according to embodiments of the present technology.

Yet another aspect of the present technology provides another, related method of preparing a circuit board for assembly. With reference to FIG. 2, the method comprises providing 210 a circuit board, providing 230 a stencil, and depositing 250 conductive paste onto the circuit board in a predetermined pattern via the stencil. In more detail, and as illustrated in cross-sectional view, the circuit board comprises: a surface layer 212; an insulating layer 214 adjacent to the surface layer; and an elongated groove 216 formed in the surface layer and extending a predetermined distance into the insulating layer, for example the groove depth extending to and terminating at a predetermined interior conductive layer of a multilayer circuit board, such as the nearest interior conductive layer to the surface layer, or a deeper interior conductive layer. The elongated groove is configured to accommodate a corresponding elongated footing of a component. The stencil comprises a plurality of apertures 232 configured for conveying conductive paste to the circuit board in the predetermined pattern when the stencil is in registration with the circuit board. A subset 234 of the plurality of apertures is configured for conveying said conductive paste to the elongated groove. A perimeter of the subset is configured 236 to substantially sealingly engage with the circuit board during conveyance of the conductive paste to the elongated groove.

Figure 3:
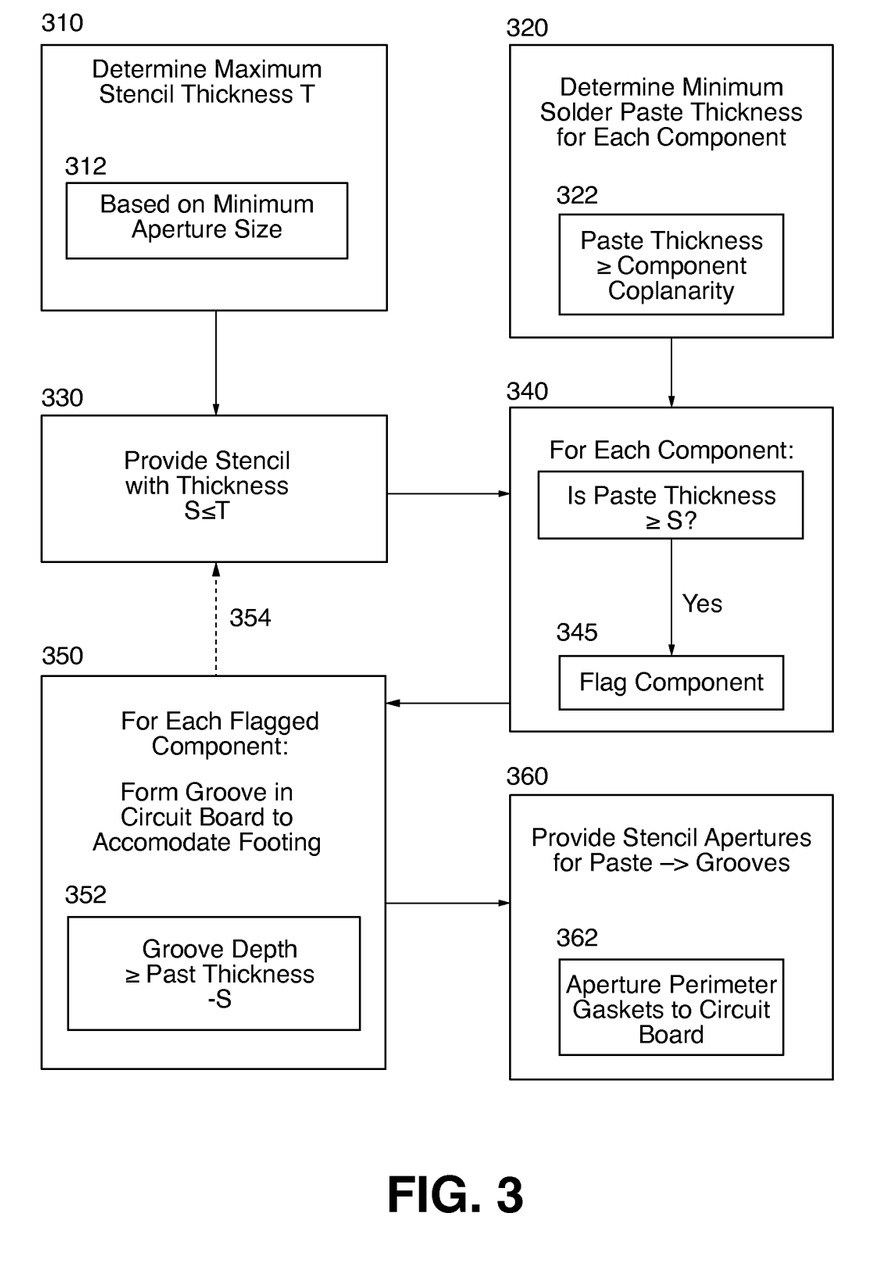
FIG. 3 illustrates a method for fabricating a circuit board and associated stencil for depositing conductive paste thereon according to embodiments of the present technology.

Yet another aspect of the present technology provides a method for fabricating a circuit board and associated stencil for depositing conductive paste thereon, a circuit board and stencil designed by that method, or both. With reference to FIG. 3, the method comprises determining 310 a maximum stencil thickness. In some embodiments, the maximum stencil thickness may be based 312 on a minimum aperture size required in the stencil for patterning conductive paste onto the circuit board. For example, the minimum aperture size may be determined by the finest-pitched footprint of components to be accommodated by the circuit board. As a further example, the thickness may be determined based on a predetermined minimum aspect ratio such as 1.1 or 1.5, or a predetermined minimum area ratio such as 0.6 or 0.66. The method further comprises determining 320 a minimum solder paste thickness for each component to be accommodated by the circuit board. For example, a requirement may be that solder paste thickness be at least equal 322 to a coplanarity measure of an associated component. The method further comprises providing 330 a stencil with a selected thickness less than or equal to the maximum stencil thickness, as determined in 310. The provided stencil may be selected from a plurality of discrete, standardized stencil thicknesses. The method further comprises comparing 340 the minimum solder paste thickness for each component, as determined in 310, to the selected stencil thickness and flagging 345 the components for which a minimum solder paste thickness exceeds the selected stencil thickness. The method further comprises forming 350, for each flagged component, one or more grooves in the circuit board to accommodate a footing of the flagged component, the one or more grooves configured 352 to have a depth at least equal to a difference between the minimum solder paste thickness for the flagged component and the selected stencil thickness. The method may further comprise providing 360 a plurality of apertures in the stencil, configured for conveying conductive paste to the grooves, such that a perimeter of the plurality of apertures is configured 362 to substantially sealingly engage with the circuit board during conveyance of the conductive paste to the grooves.

In some embodiments, the groove depths and selected stencil thickness may be determined in combination, for example by way of the groove depths informing 354 selection of stencil thickness in a loop, or by concurrent selection. For example, the stencil thickness may be selected to be as thin as possible subject to the resulting grooves being shallower than a predetermined maximum. The maximum may be, for example, the depth to a predetermined interior conductive layer of the circuit board.

In embodiments of the present technology, the groove depth is constrained such that the groove terminates at an interior conductive layer of a multilayer circuit board. The groove may thus be configured to terminate at the first, second or further interior conductive layer encountered starting from the surface layer and proceeding into the multilayer circuit board. Thus the groove depth may be quantized to the interior conductive layer depths.

As used herein, the term "conductive paste" or simply "paste" may refer to solder paste, such as tin-lead or lead-free paste, or to solder paste alternatives, such as electrically conductive resins, pastes or adhesives. The type of conductive paste to be used may depend on several factors, such as printability.

As used herein, the terms "coplanarity variation," "coplanarity," and "coplanarity measure" refers to a measurement of vertical deviation of a component's footing or footprint, such as a surface-mount electronic component, from a seating plane. Coplanarity may be measured by placing the component on a flat surface and measuring the maximum perpendicular distance from the surface to the component footing. If the entire footing contacts the surface, the coplanarity measure is zero. Coplanarity is typically assessed via statistical sampling within batches of components.

In embodiments of the present technology, the elongated groove facilitates deposition of a greater depth and volume of conductive paste therein, via processes such as stencil-based solder paste printing. For example, the depth of paste deposited within the groove may be increased, beyond the depth of paste deposited on the surface layer, by about the depth of the groove. Similarly, the volume of paste deposited may be increased, beyond the volume of paste deposited on the surface layer, by about the volume of the groove. This increased amount of paste may derive one or more benefits as described herein.

In embodiments of the present technology, an increased depth of conductive paste, as facilitated by the groove, may aid in addressing problems, such as solder opens, resulting from coplanarity issues of large components accommodated in the groove. For example, for a component having a footing with a predetermined coplanarity measure of x mm, it may be desirable to have a paste depth of at least x mm deposited on a corresponding portion of the circuit board.

In bulk manufacturing, it is typical for coplanarity variation to differ within component batches. For example, 80% of components may have a coplanarity variation less than $x_1$, 90% of components may have a coplanarity variation less than $x_2$, 95% of components may nave a coplanarity variation less than $x_3$, and so on. In embodiments of the present technology, a groove depth may be configured to accommodate component variation for a predetermined percentage of components. Generally, it is desirable to accommodate as large a percentage as feasible, subject to other considerations. For example, it may be desirable to limit the groove depth so as not to cross one or more internal conductive layers of the circuit board, so as not to compromise the structural integrity of the circuit board, or to otherwise limit expenses or yield losses.

Figure 4A:
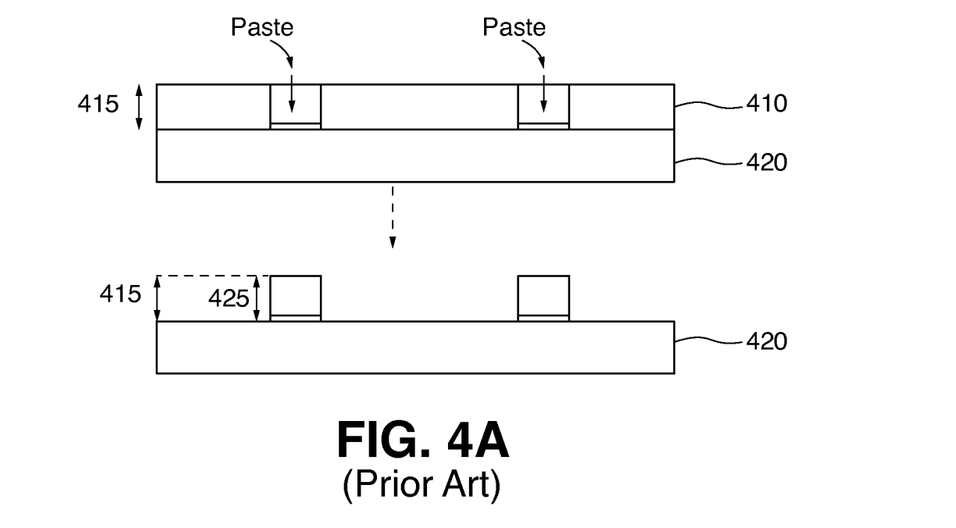
FIG. 4A illustrates a stencil on a circuit board in accordance with embodiments of the present technology.

For paste deposited by a stencil substantially flush to the circuit board, achieving a paste depth of x mm traditionally required that the stencil also be at least x mm, since the stencil apertures are substantially filled with paste due to the printing process. (Additional paste depth might be achievable by lifting the stencil away from the circuit board by a small distance, however this may not be desirable for example due to lack of gasketing of the stencil and the circuit board.) FIG. 4A illustrates how a stencil 410 having thickness 415 and flush to a circuit board 420 results in a depth 425 of deposited paste substantially the same as the stencil thickness 415.

Figure 4B:
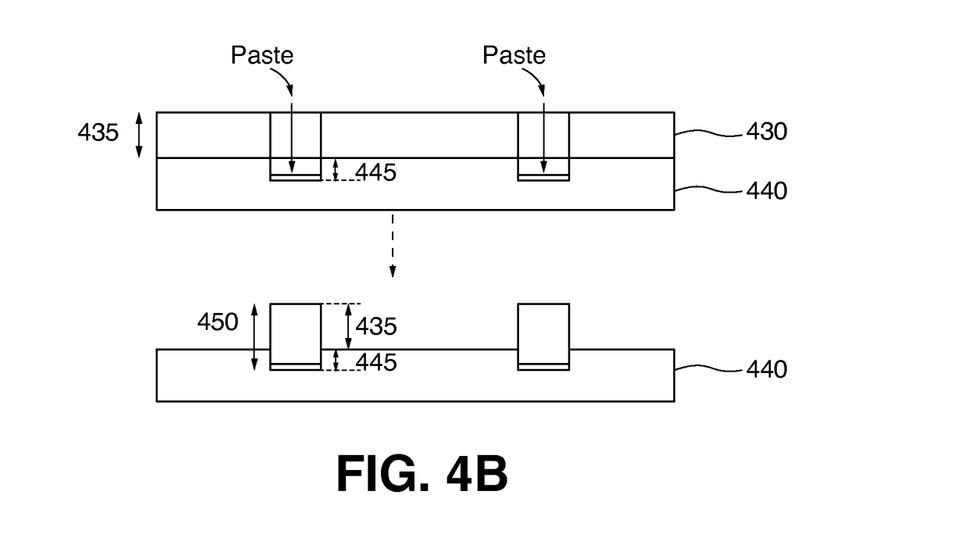
FIG. 4B illustrates a stencil on a circuit board in accordance with embodiments of the present technology.

In contrast and in accordance with the present disclosure, for paste deposited into a circuit board groove of depth y mm by a stencil substantially flush to the circuit board surface, achieving a paste depth of x mm requires that the stencil be at least (x−y) mm. This may allow the stencil thickness to be substantially reduced for a given coplanarity. Alternatively, this may allow for components with greater coplanarity to be used with a given stencil thickness. FIG. 4B illustrates how a stencil 430 having thickness 435 and flush to a circuit board 440 overtop of a groove having depth 445 can results in a depth 450 of deposited paste substantially equal to the stencil thickness 435 plus the groove depth 445. As an example, x may be about 0.1 mm, corresponding to a typical coplanarity measure of an RF shield or other component, and y may be about 0.02 mm or greater, thereby enabling the stencil thickness to be reduced from about 0.1 mm to about 0.08 mm or less. Furthermore, y may be constrained so that the groove terminates at an interior conductive layer of a multilayer circuit board.

Roughly speaking, in embodiments of the present technology, the volume and depth of stencil apertures overtop of the groove is increased by the volume and depth, respectively of a corresponding portion of the groove below the aperture. The general situation may be more complex, since the same groove may underlie plural apertures. Regardless, this effective increase in aperture volume and depth allows a corresponding increase in deposited paste volume during printing. Moreover, the problem of paste sticking to the sidewall of the stencil aperture is reduced since the stencil is made thinner than would otherwise be required for depositing paste to an adequate depth for accommodating larger components. A thinner stencil leads to an increased area ratio for a given aperture, which may lead to a reduced tendency for paste to stick in the stencil apertures.

In embodiments of the present technology, and as mentioned above, the use of grooves may allow for a thinner stencil to be used, which may be advantageous when smaller components are also to be accommodated on the circuit board.

For example, fine-pitch components typically require paste to be printed through correspondingly small stencil apertures. The small apertures in turn typically require use of a thin stencil, since apertures which are tall and narrow are generally known to produce unreliable results, for example due to excess paste sticking in the apertures. For example, some general rules of thumb dictate that the stencil aspect ratio, defined as the ratio of aperture opening to stencil thickness, should be greater than about 1.1 to 1.5, depending on how the stencil is cut. As another example, the stencil area ratio, defined as the ratio of aperture area to area of the aperture walls, should, be greater than about 0.6 or 0.66.

For example, based on a required stencil area ratio of at least 0.6, micro-BGA components having 0.3 mm pitch and hence requiring paste deposited through stencil apertures of about 0.2 mm by 0.2 mm would require a stencil thickness of about 0.08 mm or less. Hence the situation illustrated in FIG. 1B, with x=0.1 mm and y=0.02 mm or greater, may be sufficient for accommodating such micro-BGA components.

In embodiments of the present technology, the grooves may facilitate providing an alternative stenciling solution for certain mixed-component circuit boards. For example, consider a circuit board on which small components, requiring a stencil thickness of less than $z_1$ mm, and large components requiring a paste thickness of at least $z_2$ mm, are to be populated. For $z_2 > z_1$ and a planar circuit board, there is no uniform stencil thickness that accommodates both these requirements, and hence a more complex solution such as step stenciling, multi-pass printing, or the like must be implemented. Instead, by using a stencil of thickness $z < z_1$ and providing grooves in the circuit board having a depth of at least $z_2 − z$ mm, a single, uniformly-thick stencil may be used.

Furthermore, in embodiments of the present technology, the grooves may aid in containment of paste therein, which may reduce potential problems due to paste being misprinted to inappropriate regions of the circuit board.

In embodiments of the present technology, conductive paste deposited within the groove may be at least partially displaced when an elongated footing of a component is subsequently placed into the groove. Furthermore, the volume occupied by certain types of conductive paste, such as solder paste, may be reduced via further processing steps, such as reflow, as would be readily understood by a worker skilled in the art. Embodiments of the present technology may be configured to compensate for paste displacement, paste volume reduction, or both. For example, groove depths, other groove dimensions, stencil thickness, or a combination thereof, may be determined based at least in part on anticipated paste displacements, paste volume reductions, or both.

The details and particulars of these aspects of the technology will now be described below, by way of example, with reference to the attached drawings.

Figure 5A:
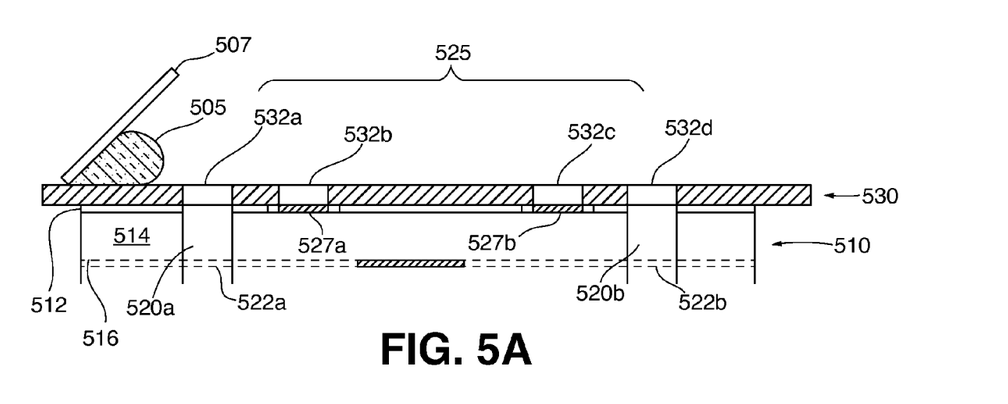
FIGS. 5A to 5E illustrate, in cross-sectional view, the deposition of conductive paste onto a circuit board via a stencil in accordance with embodiments of the present technology.

FIGS. 5A to 5E illustrate, in cross-sectional view, deposition of conductive paste 505 onto a circuit board 510 via a stencil 530, in accordance with an embodiment or the present technology. It should be noted that FIGS. 5A to 5E are not to scale, the vertical dimension being exaggerated for clarity. Referring to FIG. 5A, the conductive paste 505 is drawn across the stencil 530 by a squeegee 507, as would be readily understood by a worker skilled in the art. The paste 505 is pressed through various apertures in the stencil 530, such as apertures 532a, 532b, 532c, 532d. Apertures 532a and 532d are aligned overtop of groove portions 520a and 520b corresponding to one or more grooves formed in a surface layer 512 of the circuit board 510 and extending into an insulating layer 514. As illustrated, the groove portions 520a and 520b extend to an internal conductive layer 516 of the circuit board 510. However, the groove portions may alternatively extend partway to or even beyond the internal conductive layer 516. As also illustrated, the internal conductive layer 516 is patterned so that the bottom of the groove portions 520a and 520b comprise conductive material 522a and 522b.

Referring still to FIG. 5A, the circuit board 510 comprises a region 525 which comprises pads or lands on the surface layer 512 for receiving one or more components. Cross sections of pads 527a and 527b are illustrated in FIG. 5A. Apertures 532b and 532c are aligned overtop of pads 527a and 527b, respectively.

Figure 5B:
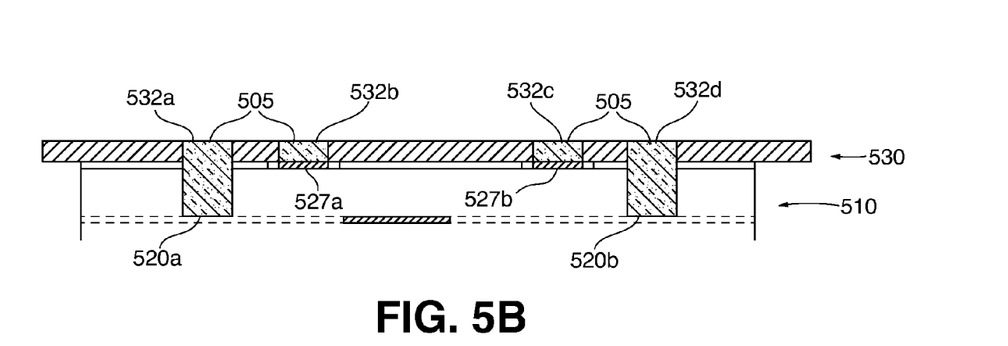

Referring to FIG. 5B, the conductive paste 505 has been deposited by the squeegee 507 into the groove and onto appropriate portions of the surface layer. For example, the groove portions 520a and 520b and corresponding apertures 532a and 532d are substantially filled with paste 505, as are the apertures 532b and 532c. Notably, the height of the paste 505 deposited through each aperture 532a, 532b, 532c, 532d reaches substantially to the upper surface of the stencil 530. Thus, the depth of the deposited paste 505 is equal to the thickness of the stencil 530 plus the depth of the groove below the stencil, where appropriate.

Figure 5C:
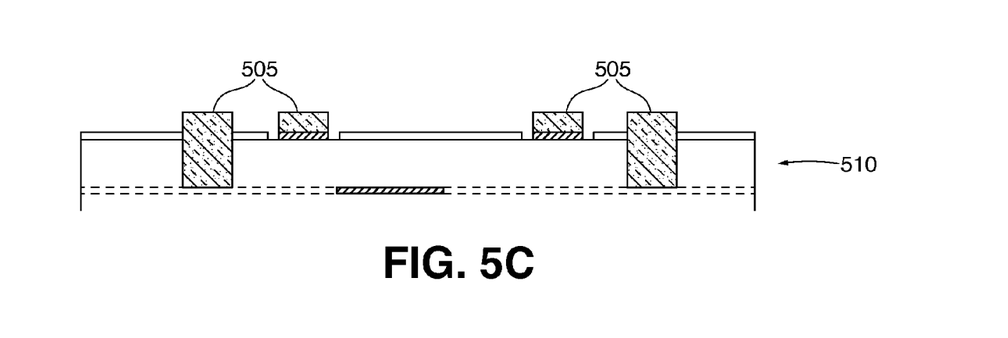
Figure 5D:
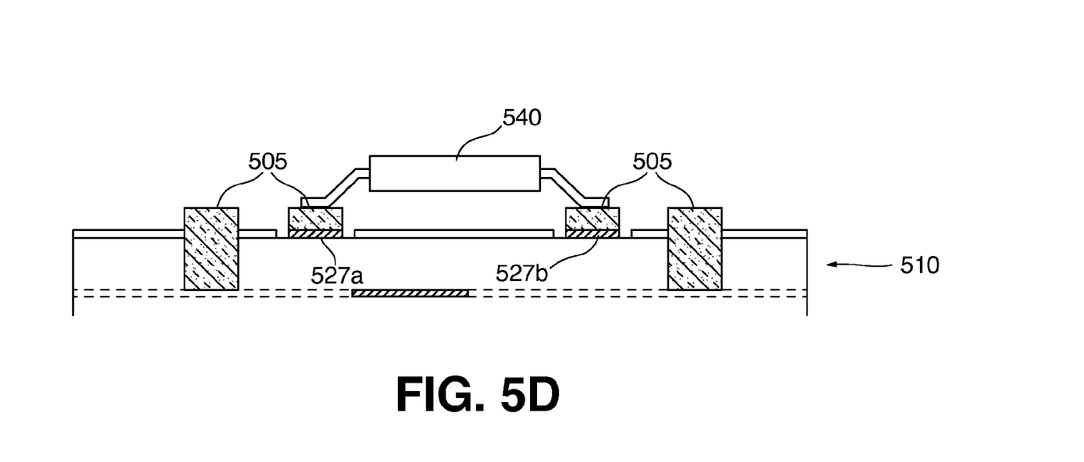
Figure 5E:
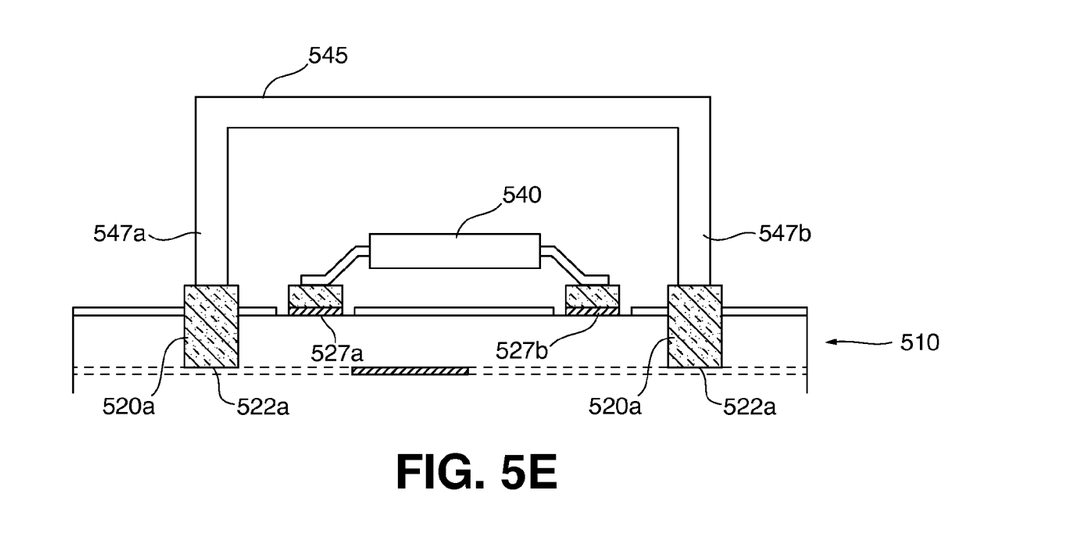

FIG. 5C illustrates the circuit board 510 with deposited paste 505, after the stencil 530 has been removed. FIG. 5D illustrates the circuit board 510 with a first, small SMT component 540, mounted at least in part above the pads 527a and 527b and held by the paste 505. FIG. 5E illustrates the circuit board 510 with a second, large SMT component 545 such as an RF shield subsequently mounted overtop of the groove, into the groove, or both. For example, footing portions 547a and 547b of the component 545 may be inserted at least partway into groove portions 520a and 520b, respectively and may optionally contact the conductive material 522a and 522b.

Figure 6A:
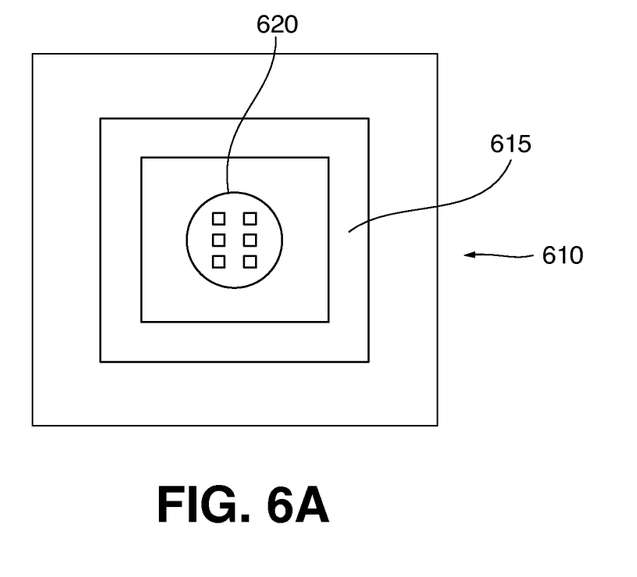
FIG. 6A illustrates a top view of a circuit board in accordance with embodiments of the present technology.

FIG. 6A illustrates a top view of a circuit board 610 provided in accordance with an embodiment of the present technology. The circuit board 610 comprises an elongated groove 615 for receiving paste, a large component, or both. The large component may be an RF shield, vibrator motor, mechanical connector, or other component. The circuit board 610 further comprises a pattern of lands 620 which receive paste via a stencil and subsequently receive SMT components placed underneath the large component. As illustrated, the groove 615 completely encircles a portion of the circuit board 610 comprising the lands 620. Other component lands or pads may be formed outside of the encircled portion. Lands or pads for plural components may be formed on the encircled portion. In other embodiments, one or more breaks may be formed in the groove 615, provided that the groove still accommodates an elongated footing of the large component, said elongated footing defining a substantial portion of a perimeter of the large component.

Figure 6B:
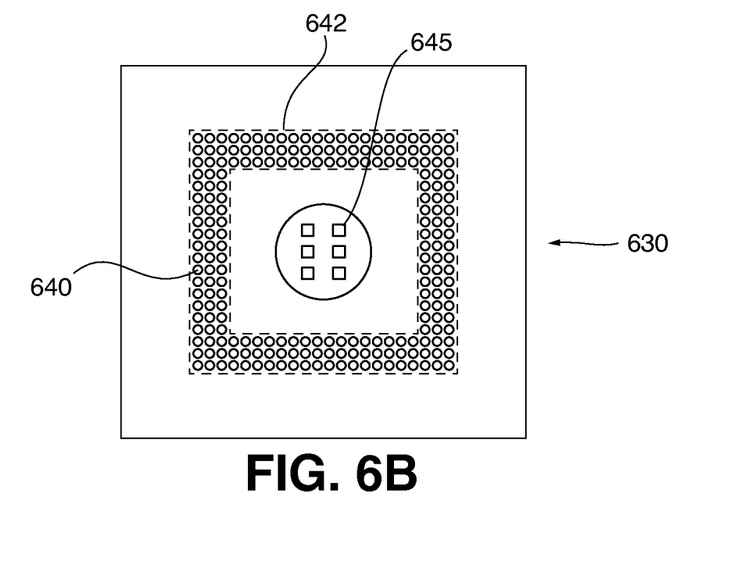
FIG. 6B illustrates a stencil comprising a set or mesh of apertures in accordance with embodiments of the present technology.

FIG. 6B illustrates a stencil 630 comprising a set or mesh of apertures 640, configured to facilitate deposition of paste into the groove 615 of the circuit board 610, in accordance with embodiments of the technology. The stencil 630 may comprise other apertures for depositing paste onto other pads and/or lands of the circuit board surface, such as apertures 645. The stencil 630 is placed substantially flush to the circuit board 610 and registered therewith by aligning the stencil pattern with circuit board features such as pads 615 and groove 620, for accurate deposition of conductive paste, as would be readily understood by a worker skilled in the art. The set or mesh of apertures 640 over the groove 620 is configured to convey conductive paste to the entirety of the groove. The set or mesh of apertures 640, may define a perimeter 642 which substantially sealingly engages, or gaskets, with the groove 620, thereby facilitating deposition of paste into the groove while inhibiting deposition of paste immediately adjacent to the groove. Alternatively, a single aperture may be used for deposition of paste in a sufficiently small groove, provided that such an aperture does not completely separate the stencil into separate pieces.

Embodiments of the technology relate to single-layer or multilayer printed circuit boards having a predetermined total thickness, for example 63 mils (1.57 mm) or 93 mils. Insulating layers, situated between the conductive layers, may have a thickness which depends in part on the total board thickness and the number of internal conductive layers of a multilayer board. In some embodiments, insulating layer thickness may be in the 50 µm to 100 µm range, 100 µm to 300 µm range, or greater. A groove cut from the surface layer entirely through the first insulating layer to the next conductive layer may thus provide additional depth of paste commensurate with the insulating layer thickness. This additional depth may be sufficient to compensate for relatively high coplanarity of large components.

In an exemplary embodiment, a groove, which surrounds substantially all of a predetermined region of the circuit board surface layer, is 70 µm to 80 µm deep and 0.5 mm to 1 mm wide. An associated stencil may be 70 µm to 100 µm thick, for example. Thus, use of a groove to accommodate a component with 100 µm coplanarity may allow stencil thickness to be decreased from 4 mils (about 100 µm) to a lower thickness, such as 3 mils (about 75 µm).

In some embodiments, the stencil comprises an aperture or set of apertures, for conveying conductive paste into the elongated groove, the aperture or set of apertures being wider than the elongated groove. Thus the stencil is configured to facilitate a predetermined degree of overprinting to the groove, which may facilitate deposition of an increased amount of paste, deposition of paste at an increased rate, or both.

In embodiments of the present technology, if the elongated groove penetrates a multilayer circuit board to or past one or more internal layers, traces patterned on those internal layers may have to be re-routed to accommodate the groove, as would be readily understood by a worker skilled in the art.

In embodiments of the present technology, the component accommodated in the groove is an RF shield, which may be fitted overtop of other smaller components to shield same. In embodiments of the present technology, the component accommodated in the groove is another large component such as a motor housing, connector, or other component. Such components may comprise a portion, such as an outer perimeter connector, which is to be attached to the circuit board to provide mechanical strength. This portion may further exhibit relatively high coplanarity variation. Thus, these portions of the components may benefit from being accommodated in a groove, which allows for a greater depth of conductive paste and hence increased mechanical strength, increased tolerance for coplanarity variation, or both.

In embodiments of the present technology, the outer perimeter connector of a component such as a motor housing, connector, or other component, may be connected to a ground plane via the bottom of the groove. Other connectors of the component, for example power connectors, signal connectors, or both, may be connected to predetermined portions of the circuit board by wires extending from inside or outside a perimeter of the groove, or by connectors that mate with lands on the surface layer of the circuit board. Thus, in some embodiments, the large component may be coupled to both the elongated groove and to pads or lands on the circuit board surface layer. Conductive paste may be applied to both the elongated groove and pads or lands via a stencil, as described herein.

Figure 7:
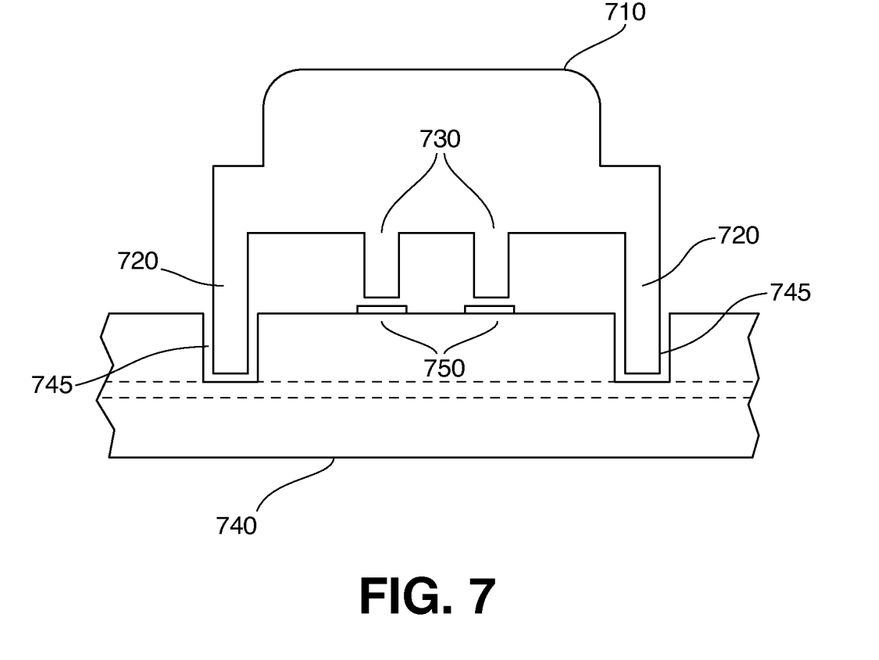
FIG. 7 illustrates, in cross-sectional view, a circuit board accommodating a component via both an elongated groove and surface-layer pads.

FIG. 7 illustrates, in cross section, a component 710 having an elongated rooting 720 and one or more additional terminals 730. For example, the elongated footing 720 may function as a ground connector, while the additional terminals 730 may function as power connectors, signal connectors, or the like, or a combination thereof. The circuit board 740 comprises an elongated groove 745 which is configured to accommodate the elongated footing 720. The bottom of the elongated groove 745 is connected to a ground plane of the circuit board. The circuit board 740 further comprises pads 750 on the circuit board surface layer which are configured to mate with the additional terminals 730. In one embodiment, one or more apertures (not shown) are provided in the component 710 for accessing the interface between the additional terminals 730 and the pads 750. The apertures may provide air access for facilitating solder paste reflow in a reflow oven, mechanical access, or both.

In embodiments of the present technology, the groove may be used to accommodate components in order to reduce the overall height of the circuit assembly. For example, a component having a predetermined height h accommodated in a groove of depth y may result in the component rising above the surface layer to a distance of h−y, which is less than h. This may facilitate providing a circuit assembly with a lower overall profile provided the higher components are accommodated in a groove.

This technology has been described in terms of specific implementations and configurations (and variants thereof) which are intended to be exemplary only. The scope of the exclusive right sought by the applicant is therefore intended to be limited solely by the appended claims.

The invention claimed is:

1. A method of providing a circuit board prepared for assembly, the method comprising:
   a) providing the circuit board, the circuit board comprising:
      i) a surface layer having a predetermined region configured to accommodate a first component;
      ii) an insulating layer adjacent to the surface layer; and
      iii) an elongated groove formed in the surface layer adjacent to the predetermined region, the elongated groove extending a determined depth into the insulating layer and configured to accommodate a corresponding elongated footing of a second component, a body portion of the second component extending overtop of the first component, said elongated footing defining a substantial portion of a perimeter of the second component; and
   b) depositing conductive paste onto the circuit board, the conductive paste deposited on the predetermined region in a pattern corresponding to a footprint of the first component, the conductive paste further deposited in the elongated groove for reliably accommodating the elongated footing of the second component;
   wherein the determined depth is determined by:
      i) determining a maximum stencil thickness based on a minimum aperture size required in a stencil to be used for depositing conductive paste onto the surface layer for accommodating the first component;
      ii) determining a minimum conductive paste depth required for the second component;
      iii) providing the stencil having a selected stencil thickness less than or equal to the maximum stencil thickness;
      iv) comparing the minimum conductive paste depth for the second component with the selected stencil thickness, the minimum conductive paste depth exceeding the selected stencil thickness; and
      v) determining the determined depth to be at least equal to a difference between the minimum conductive paste depth and the selected stencil thickness.

2. The method according to claim 1, wherein the conductive paste is deposited concurrently onto the predetermined region and into the elongated groove via the stencil.

3. The method according to claim 2, wherein the selected stencil thickness is selected at least in part to facilitate said deposition of the conductive paste in the pattern corresponding to the footprint of the first component.

4. The method according to claim 3, wherein the elongated footing has a predetermined coplanarity variation, conductive paste is applied to the groove to a depth substantially equal to a depth of the groove plus the selected stencil thickness, and the determined depth is at least equal to the predetermined coplanarity variation.

5. The method according to claim 2, wherein the stencil comprises one or more apertures for deposition of the conductive paste into the elongated groove, the one or more apertures defining a perimeter around the elongated groove, the stencil configured to substantially sealingly engage with the circuit board during deposition of the conductive paste into the elongated groove.

6. The method according to claim 1, further comprising populating the circuit board with at least the first component followed by at least the second component.

7. The method of claim 1, wherein the first component is a surface mount component and the second component is a radio frequency shield.

8. A method of preparing a circuit board, the circuit board comprising: a surface layer having a predetermined region configured to accommodate a first component; and an insulating layer adjacent to the surface layer; the method comprising: forming an elongated groove in the surface layer adjacent to the predetermined region, the elongated groove extending a determined depth into the insulating layer and configured to accommodate a corresponding elongated footing of a second component, a body portion of the second component extending overtop of the first component, said elongated footing defining a substantial portion of a perimeter of the second component; wherein the determined depth is determined by:
   i) determining a maximum stencil thickness based on a minimum aperture size required in a stencil to be used for depositing conductive paste onto the surface layer for accommodating the first component;
   ii) determining a minimum conductive paste depth required for the second component;
   iii) providing the stencil having a selected stencil thickness less than or equal to the maximum stencil thickness;
   iv) comparing the minimum conductive paste depth for the second component with the selected stencil thickness, the minimum conductive paste depth exceeding the selected stencil thickness; and
   v) determining the determined depth to be at least equal to a difference between the minimum conductive paste depth and the selected stencil thickness.

9. The method according to claim 8, wherein the elongated footing has a predetermined coplanarity variation, and wherein conductive paste is applied in the groove to a paste depth at least equal to the determined depth, and wherein the determined depth is at least equal to the predetermined coplanarity variation.

10. The method according to claim 9, wherein the conductive paste is deposited via the stencil, and wherein the paste depth is substantially equal to a depth of the groove plus the selected stencil thickness.

11. The method according to claim 10, wherein the conductive paste is deposited via the stencil to both the elongated groove and to the predetermined region, the conductive paste deposited to the predetermined region in a pattern corresponding to a footprint of the first component.

12. The method according to claim 11, wherein the selected stencil thickness is selected at least in part to facilitate said deposition of the conductive paste in the pattern corresponding to the footprint of the first component.

13. The method according to claim 8, wherein the elongated groove extends to an internal conductive layer of the circuit board.

14. The method according to claim 8, wherein the determined depth is configured at least in part to compensates for paste displacement due to the elongated footing, paste volume reduction due to further processing, or both.

15. The method according to claim 8, wherein the stencil comprises one or more apertures for deposition of the conductive paste into the elongated groove, the one or more apertures defining a perimeter around the elongated groove, the stencil configured to substantially sealingly engage with the circuit board during deposition of the conductive paste into the elongated groove.

16. The method according to claim 8, further comprising populating the circuit board with at least the first component followed by at least the second component.

17. The method of claim 8, wherein the first component is a surface mount component and the second component is a radio frequency shield.

\* \* \* \* \*

UNITED STATES PATENT AND TRADEMARK OFFICE
CERTIFICATE OF CORRECTION

PATENT NO.         : 9,162,303 B2
APPLICATION NO.    : 13/187881
DATED              : October 20, 2015
INVENTOR(S)        : Li et al.

Page 1 of 1

It is certified that error appears in the above-identified patent and that said Letters Patent is hereby corrected as shown below:

In the claims:

Column 10, line 56, claim 9, delete "and" after "variation,"
Column 11, line 11, claim 14, delete "is configured at least in part to" after "depth"

Signed and Sealed this
Twelfth Day of April, 2016

Michelle K. Lee
*Director of the United States Patent and Trademark Office*